United States Patent [19]
Solberg

[11] Patent Number: 6,147,401
[45] Date of Patent: Nov. 14, 2000

[54] COMPLIANT MULTICHIP PACKAGE

[75] Inventor: Vernon Solberg, Saratoga, Calif.

[73] Assignee: Tessera, Inc., San Jose, Calif.

[21] Appl. No.: 09/500,364

[22] Filed: Feb. 8, 2000

Related U.S. Application Data

[62] Division of application No. 08/989,710, Dec. 12, 1997, Pat. No. 6,054,337.
[60] Provisional application No. 60/033,352, Dec. 13, 1996.

[51] Int. Cl.[7] .................................................... H01L 23/30
[52] U.S. Cl. ........................ 257/723; 257/724; 257/737; 257/738; 257/668; 257/777; 257/778; 257/780; 438/107; 438/106; 438/108
[58] Field of Search ................................... 257/723, 724, 257/737, 738, 668, 685, 686, 777, 778, 780; 438/107, 106, 108

[56] References Cited

U.S. PATENT DOCUMENTS

| | | |
|---|---|---|
| 5,148,265 | 9/1992 | Khandros et al. . |
| 5,148,266 | 9/1992 | Khandros et al. . |
| 5,270,261 | 12/1993 | Bertin et al. . |
| 5,347,159 | 9/1994 | Khandros et al. . |
| 5,390,844 | 2/1995 | Distefano et al. . |
| 5,398,863 | 3/1995 | Grube et al. . |
| 5,455,390 | 10/1995 | DiStefano et al. . |
| 5,489,749 | 2/1996 | DiStefano et al. . |
| 5,491,302 | 2/1996 | Distefano et al. . |
| 5,518,964 | 5/1996 | DiStefano et al. . |
| 5,534,467 | 7/1996 | Rostoker . |
| 5,536,909 | 7/1996 | DiStefano et al. . |
| 5,659,952 | 8/1997 | Kovac et al. . |
| 5,808,878 | 9/1998 | Saito et al. ............................... 361/818 |

*Primary Examiner*—Tom Thomas
*Assistant Examiner*—Luan Thai
*Attorney, Agent, or Firm*—Lerner, David, Littenberg, Krumholz & Mentlik, LLP

[57] ABSTRACT

A multichip package includes a substrate including a plurality of conductive traces and flexible leads connected to outer ends of at least some of the conductive traces adjacent the periphery of said flexible substrate, the substrate including conductive terminals accessible at a surface thereof connected to at least some of the traces. The package includes a first microelectronic element having a front face including contacts and a back face, the front face of the first microelectronic element confronting the flexible substrate. The package also includes a second microelectronic element larger than the first microelectronic element, the second microelectronic element having a front face including contacts, the second microelectronic element overlying the first microelectronic element with the front face of the second microelectronic element facing toward the substrate. A compliant element is disposed alongside the first microelectronic element between the second microelectronic element and the substrate. The flexible leads are connected to the second microelectronic element and at least some of the traces are connected to the first microelectronic element for electrically interconnecting the first and second microelectronic elements with one another and with the terminals.

16 Claims, 10 Drawing Sheets

COMPLIANT MULTICHIP PACKAGE

CROSS-REFERENCE TO RELATED APPLICATIONS

This application claims benefit of U.S. Provisional Patent Application Serial No. 60/033,352 filed Dec. 13, 1996, the disclosure of which is incorporated by reference herein. This application is also a divisional of U.S. patent application Ser. No. 08/989,710 filed Dec. 12, 1997, now U.S. Pat. No. 6,054,337, the benefit of which is claimed pursuant to 35 U.S.C. Section 120.

FIELD OF THE INVENTION

The present invention relates to the art of electronic packaging, and more specifically relates to compliant multichip packages and to methods of making the same.

BACKGROUND OF THE INVENTION

Modern electronic devices utilize semiconductor chips, commonly referred to as integrated circuits which incorporate numerous electronic elements. These chips are typically mounted on external circuit elements, such as printed circuit boards, which physically support the chips and electrically interconnect each chip with other elements of the circuit. As described in U.S. Pat. Nos. 5,148,265; 5,148,266; 5,455,390, 5,518,964 and the corresponding WO 96/02068 published Jan. 25 1996, as well as in co-pending, commonly assigned U.S. patent application Ser. Nos. 08/653,016 filed May 24, 1996; 08/678,808 filed Jul. 12, 1996 as well as 08/532,528 filed Sep. 22, 1995, the disclosures of which are all incorporated by reference herein, it may be desirable to provide interconnections between the contacts on a chip and the external circuit element by providing a flexible dielectric element having conductive terminals and flexible leads. The dielectric element is generally a flexible substrate and is typically referred to as an "interposer" or a "chip carrier." The dielectric element is preferably juxtaposed with the chip so that the chip and the dielectric element may be electrically interconnected by connecting the leads of the dielectric element to the contacts of the chip. The electrically interconnected chip and dielectric element is typically referred to as a "chip package." In turn, the terminals on the dielectric element may be connected to the external circuit element by, inter alia, solder bonding the terminals to the contact pads of the external circuit element. During operation, the dielectric element of the package remains movable with respect to the chip so as to compensate for thermal expansion and contraction of the elements. In other words, the chip can move with respect to the dielectric element as the chip grows and shrinks during changes in temperature. In a particularly preferred arrangement, a compliant dielectric layer is incorporated into the package. The compliant layer, which may be formed from a soft material such as a gel, elastomer, foam or the like, preferably lies between the chip and the terminals of the dielectric element. The compliant layer mechanically decouples the dielectric element and terminals from the chip and facilitates movement of the chip and the dielectric element relative to one another. The compliant layer may also permit movement of the terminals in the Z direction, i.e. towards the chip, which further facilitates testing and mounting of the chip package. As further disclosed in the above-mentioned patents and patent applications, one or more chips may be mounted to a common dielectric element or interposer. Alternatively, several chips may be mounted in a single package, commonly referred to as a "multichip module." These chips may be connected to one another and to a common set of external connecting elements, so that the entire chip package can be mounted to the substrate as a unit. The dielectric element may incorporate conductive traces which form interconnections between the various chips and electronic components of the package and which completes circuits as required.

The size of the chip and the chip packages is a major concern, because the size of each such package influences the overall size of the electronic device. Moreover, the size of each package controls the required distance between each of the chips within the package as well as the distance between each chip and the other elements of the circuit. Delays in transmission of electrical signals between chips, which limit the operating speed of the device, are directly related to these distances. For example, in a computer where a central processing unit operates cyclically, signals must be interchanged between the central processing unit chip and other chips during each cycle. The transmission delays inherent in such interchanges often limit the cycling rate of the central processing chip. Thus, more compact interconnection assemblies, with smaller distances between chips and smaller signal transmission delays, are necessary to provide for faster operation of the central processing chip.

One embodiment of the invention taught in the above-mentioned '265 Patent includes a plurality of semiconductor chip assemblies stacked one atop the other. Each individual semiconductor chip assembly includes a chip having a front contact-bearing face and a rear surface. The assembly includes an interposer overlying the front face of the chip and having central terminals which are connected to the chip contacts through conductive leads. In turn, the leads have outer extensions extending outwardly beyond the chip contacts and beyond the edges of the chip. A sheet-like backing element having conductive terminals on a surface thereof abuts the rear face of chip, so that the chip is sandwiched between the backing element and the interposer. A plurality of the above-described chip assemblies are combined to form a larger, multichip circuit assembly, whereby the chip assemblies are electrically interconnected and stacked one atop the other, with the backing element of each chip assembly overlying the interposer of the next lower chip assembly.

Commonly assigned U.S. Pat. No. 5,347,159, the disclosure of which is hereby incorporated by reference herein, also discloses a stacked chip assembly including a plurality of semiconductor chips which are stacked one atop the other and electrically interconnected. In one embodiment, a stacked chip assembly includes three chips: a top chip, an intermediate chip and a bottom chip. The chips are electrically interconnected with one another and the assembly is electrically connected to an external circuit element.

The stacked circuit assemblies or multichip packages shown and described in the '265 and '159 Patents are particularly useful for accommodating large numbers of chips in a small area. The chips are stacked in essentially the same circuit board area as ordinarily occupied by a single chip. These stacked packages are especially useful with memory chips such as random access memory chips, whereby the chips are provided with parallel connections to a data bus.

However, still further improvements in chip assemblies and in the methods utilized to make the same would be desirable.

SUMMARY OF THE INVENTION

One aspect of the invention provides a multichip package. A package in accordance with this aspect of the invention includes a substrate, most preferably a flexible substrate such as a dielectric sheet. The substrate has a plurality of conductive traces and flexible leads connected to outer ends of said conductive traces adjacent the periphery of said flexible substrate. The substrate also has conductive terminals accessible at one or more surfaces thereof which are connected to at least some of said traces.

The package also includes first and second microelectronic elements. The first microelectronic element typically is a relatively small semiconductor chip such as a memory chip, and has a front face including contacts and a back face. The front face of the first microelectronic element confronts the flexible substrate, typically adjacent the center of the substrate. The second microelectronic element typically is larger than the first microelectronic element. Preferably, the second microelectronic element is a chip such as a microprocessor, microcontroller or application specific integrated circuit ("ASIC") which must interchange signals with the first microelectronic element during operation. The second microelectronic element has a front face including contacts. The second microelectronic element overlies the first microelectronic element and substrate, with the front face of said second microelectronic element facing toward said substrate. Typically, the second microelectronic element extends outwardly beyond the first microelectronic element.

Most preferably, the package also includes a compliant element disposed alongside the first microelectronic element, between the second microelectronic element and the substrate. The compliant element desirably includes a compliant layer extending between the back face of the first microelectronic element and the front face of the first microelectronic element.

The flexible leads, and hence at least some of the traces, are connected to the contacts of the second microelectronic element. At least some of the traces are connected to the contacts of the first microelectronic element and to the contacts of the second microelectronic element for electrically interconnecting the first and second microelectronic elements with one another and with the terminals on the substrate.

Packages in accordance with these aspects of the present invention provide microelectronic elements stacked closely together in a vertical configuration, and connected to one another. Stacking the microelectronic elements closely together reduces both the distance between the microelectronic elements and the length of the conductive traces interconnecting the microelectronic elements. As a result, the signal transmission time between the microelectronic elements will be shorter and the clock speed of the microelectronic elements may be increased. In certain cases, the chips packaged in the multichip package of the present invention can perform more functions in the same amount of time than similar chips provided in standard microelectronic packages. For example, the operating speed of a microprocessor is sometimes limited by the speed at which the microprocessor can exchange data with an associated memory. Where the memory and the microprocessor are provided in a package according to this aspect of the invention, the rate of data exchange, and hence the speed of operation of the microprocessor, may be increased.

The stacked multichip packages according to this aspect the present invention also save valuable "footprint" space on the circuit board so that the overall size of the electronic devices incorporating the package may be reduced. The package which provides interconnection between the first and second microelectronic elements also provides electrical connections between one or both of these elements and a larger circuit. Thus, the packaged microelectronic elements can be connected to a larger circuit by connecting the terminals on the substrate to the larger circuit, as by bonding the terminals to contact pads on a circuit panel. Moreover, the compliant element and flexible leads provide mechanical decoupling at least between the relatively large second microelectronic element and the substrate. The package therefore can compensate for thermal expansion and contraction during operation while maintaining reliable electrical connections.

Further aspects of the present invention provide methods of making a compliant multichip packages. Such a method desirably includes the steps of providing a substrate, most preferably a flexible substrate such as a sheet-like dielectric film, having a plurality of conductive traces and flexible leads connected to outer ends of the conductive traces adjacent to the periphery of the flexible substrate, the flexible substrate including conductive terminals accessible at a surface thereof connected to at least some of the conductive traces. The flexible substrate has a first surface and a second surface and may include an interior bond window. The inner ends of the conductive traces may extend at least partially across the interior bond window. In certain embodiments the inner ends of the conductive traces may also include flexible leads. The flexible substrate may also include an exterior bond window adjacent the periphery of the flexible substrate, with the flexible leads connected to the outer ends of the conductive traces extending at least partially across the exterior bond window. The flexible substrate preferably includes an inner region and an outer region surrounding the inner region with the exterior bond window lying between the inner and outer regions. The inner region of the flexible substrate desirably includes a central region which is bounded and defined by the interior bond window.

A first microelectronic element, having a front face including contacts and a rear surface is assembled with the flexible substrate. The front face of the first microelectronic element preferably includes a central portion and a peripheral portion surrounding the central portion, with the contacts of the first microelectronic element disposed in the peripheral portion thereof. During assembly with the flexible substrate, the central portion of the first microelectronic element is abutted against the central region of the flexible substrate with the contacts of the first microelectronic element aligned with the interior bond window and the interior ends of the traces.

A second microelectronic element, such as a microprocessor or microcontroller, preferably having a front face including contacts is assembled with the first microelectronic element and substrate so that the front face of the second microelectronic element overlies the first microelectronic element and the flexible substrate. The second microelectronic element is preferably larger than the first microelectronic element, and the second microelectronic element thus protrudes beyond the periphery of the first microelectronic element. The front face of the second microelectronic element may include a central portion and a peripheral portion surrounding the central portion with the contacts of the second microelectronic element disposed in the peripheral portion of the front face. During assembly, the contacts of the second microelectronic element are aligned with the flexible leads connected to outer ends of the conductive traces adjacent the periphery of the flexible substrate.

The first and second microelectronic elements are preferably electrically interconnected with one another and with the conductive terminals by connecting the flexible leads to the second microelectronic element and connecting at least some of the inner ends of the conductive traces to the first microelectronic element.

A compliant element, preferably comprising a resilient material such as a silicone elastomer, most preferably is provided in the space between the second microelectronic element and the substrate. Thus, the compliant element extends alongside of the first microelectronic element. The compliant element desirably also extends between the rear surface of the first microelectronic element and the front surface of the second microelectronic element. The compliant element may be provided as a pre-formed element such as a substantially continuous compliant pad which is deposited over the rear surface of the first microelectronic element and the flexible substrate, during the assembly process. The compliant pad desirably includes a pre-formed cut-out region therein having dimensions substantially similar to the dimensions of the sides and rear surface of the first microelectronic element. The cut-out region preferably intimately surrounds the sides and the rear surface of the first microelectronic element after being deposited thereover.

The compliant element may also be formed by allowing a curable liquid to flow into the assembly and curing the liquid. For example, standoffs, such as a plurality of compliant pads defining channels therebetween, may be provided between the first and second microelectronic elements, between the second microelectronic element and the substrate, or both. When the curable liquid is introduced the curable liquid flows through the channels between the compliant pads. Before the curable liquid is introduced, a protective layer, such as a coverlay, is preferably provided to cover the interior and exterior bond windows and protect the terminals from contamination by the liquid.

The multichip package may be connected to an external circuit element, such as a printed circuit board, via the conductive terminals of the flexible substrate.

Further aspects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Referring to FIGS. 1A–2B, one embodiment of the present invention provides a method of making a compliant multichip package 20 which includes providing a flexible substrate 22 having a top surface 24 and a bottom surface 26. The flexible substrate 22 preferably includes a sheet-like dielectric film of the type used in tape automated bonding ("TAB") processes. The flexible substrate 22 is provided with sprocket holes 28 to facilitate feeding and movement of the flexible substrate 22 during various assembly processes. The flexible substrate is preferably about 0.01 to about 0.1 millimeters thick. The terms "top" and "bottom" are used herein to indicate directions relative to the structure of the compliant multichip package itself. It should be understood that these terms are used to refer to the frame of reference of the package itself, and not to the ordinary, gravitational frame of reference. Likewise, the terms "front" and "rear" and "upwardly" and "downwardly" should also be understood as referring to the frame of reference of the component itself.

Figure 1A:
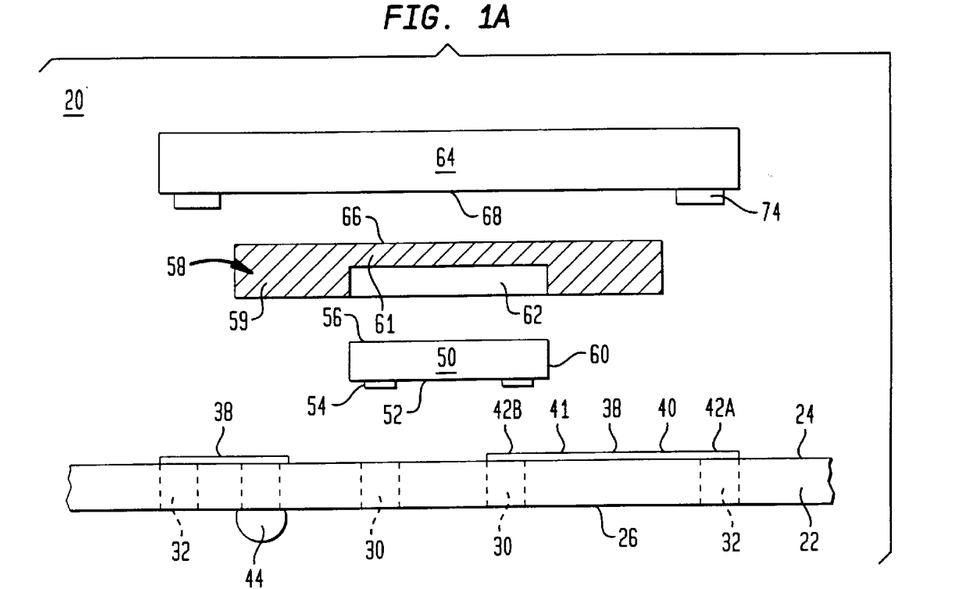
FIG. 1A shows an exploded side view of a compliant multichip package according to one preferred embodiments of the present invention.
Figure 2A:
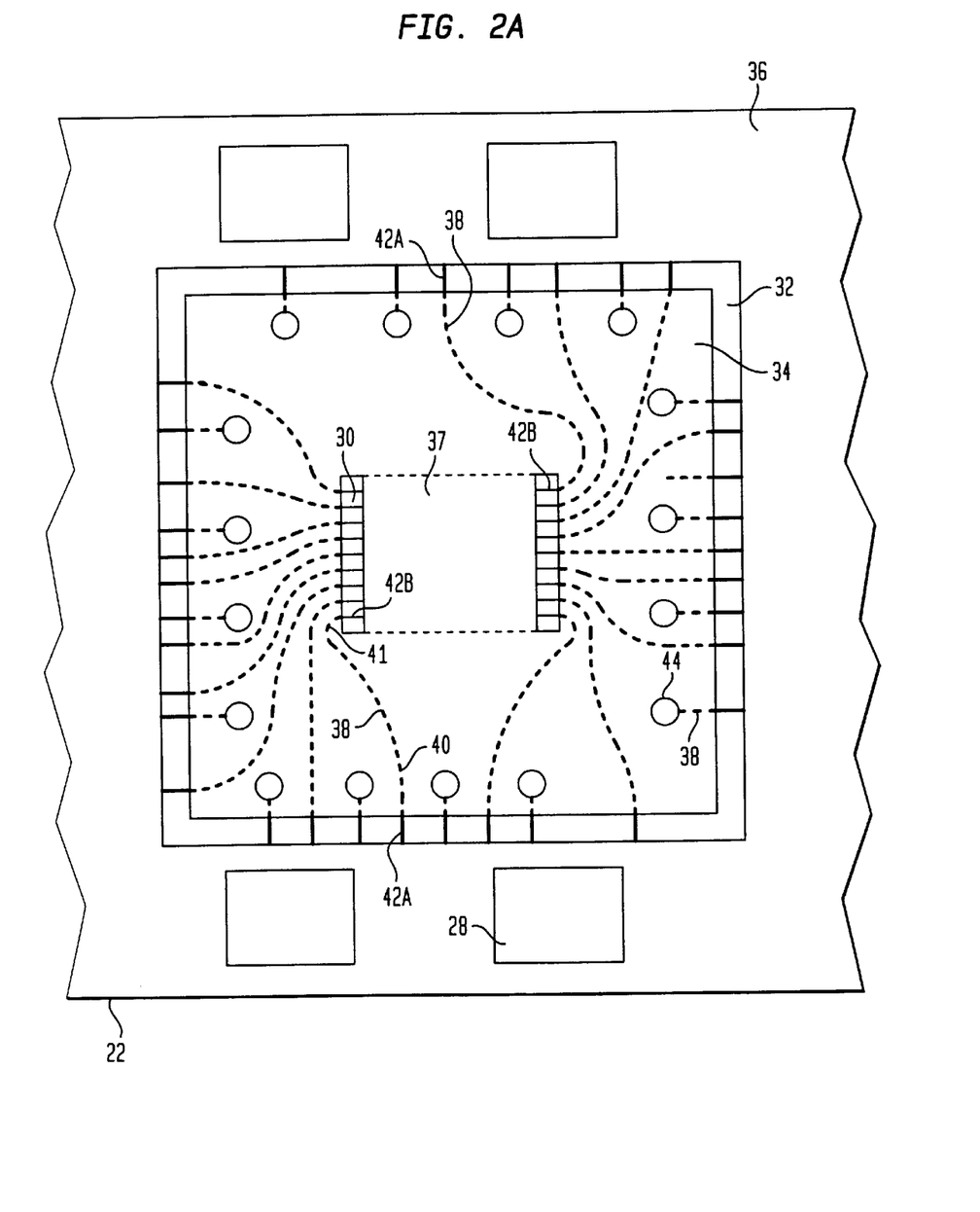
FIG. 2A shows a bottom fragmentary view of a flexible substrate used in the compliant multichip package shown in FIG. 1 in accordance with one preferred embodiment of the present invention.
Figure 2B:
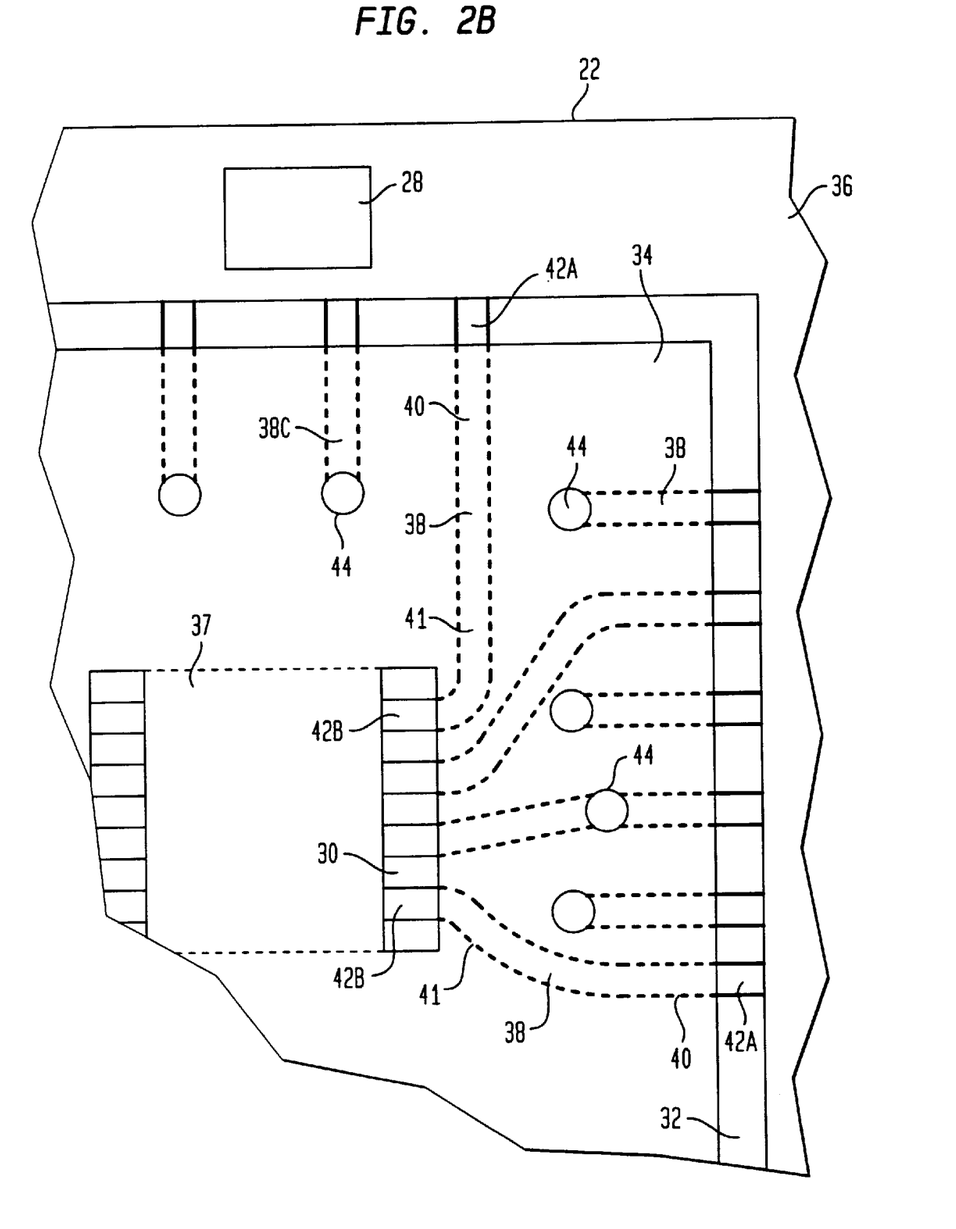
FIG. 2B shows a close-up view of a portion of the flexible substrate shown in FIG. 2A.

In the embodiment of FIGS. 1 and 2, the flexible substrate 22 has an interior bond window 30 and an exterior bond window 32. The interior bond window 30 and the exterior bond window 32 include gaps in the form of elongated channels which extend through the flexible substrate 22 from the top surface 24 to the bottom surface 26 thereof. The interior bond window 30 includes two channels which are substantially parallel to one another; however, the interior bond window may have more or less than two substantially parallel channels depending on the chip or microelectronic component selected for attachment to the flexible substrate 22. The exterior bond window 32 includes gaps which are contiguous with one another to form a square or ring-shaped bond window. The flexible substrate 22 includes an inner region 34 and a peripheral region 36 which surrounds the inner region 34, the exterior bond window 32 lying between the inner region 34 and the peripheral region 36. The inner region 34 of the flexible substrate 22 also includes a central region 37 which is bounded and defined by the interior bond window 30.

Referring to FIGS. 2A and 2B, the flexible substrate 22 includes a plurality of conductive traces 38 having outer ends 40 extending toward the peripheral region 36 of the flexible substrate and inner ends 41 extending toward the central region 37 of the flexible substrate. The conductive traces 38 are desirably photolithographically defined from a single sheet of copper attached, such as by lamination, electroplating or sputtering processes, to the top surface 24 of the flexible substrate 22. The substrate includes flexible leads 42A connected to outer ends 40 of the conductive traces 38. The flexible leads 42A at the outer ends 40 of the conductive traces 38 extend at least partially across the exterior bond window 32. Thus, the inner region 34 of the flexible substrate 22 is temporarily connected to the peripheral region 36 of the flexible substrate 22 by the flexible leads which extend across the exterior bond window 32. The flexible leads 42A connected to the outer ends 40 of the conductive traces 38 are preferably configured to be detachable from the peripheral region of flexible substrate 22. Detachable lead structures are described in commonly assigned U.S. Pat. Nos. 5,489,749 and 5,536,909, the disclosures of which are hereby incorporated by reference herein. Flexible leads 42B connected to the inner ends 41 of the conductive traces 38 extend at least partially across the interior bond window 30. Leads 42B may be detachably secured to the central region 37, or else may be permanently secured on both sides of the slot or interior bond window 30. The flexible substrate 22 includes conductive terminals 44 accessible at the bottom surface 26 thereof which are connected to at least some of the conductive traces 38.

Figure 1B:
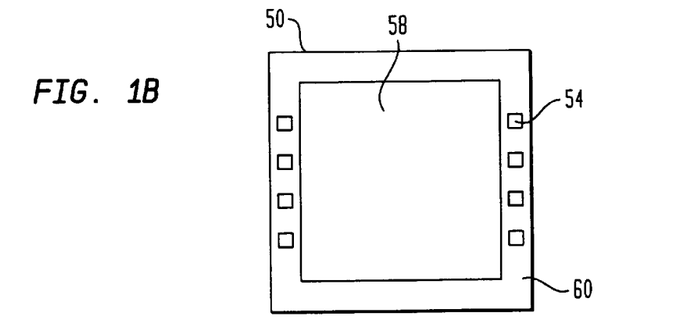
FIG. 1B shows a front view of a first microelectronic element shown in FIG. 1A.

Referring to FIGS. 1A–1B, a first microelectronic element 50, preferably a relatively small semiconductor chip such as a memory chip, has a front face 52 including contacts 54 and a rear surface 56. The first microelectronic element 50 has a central region 58 and a peripheral region 60 surrounding the central region 58 with the contacts 54 on the front face 52 thereof being disposed in the peripheral region 60. The first microelectronic element 50 is assembled with the flexible substrate 22 so that the central portion 58 thereof is abutted against the central region 37 of the flexible substrate 22, with the contacts 54 aligned with the interior bond window 30. Alignment of the contacts 54 with the interior bond window 30 facilitates bonding of the flexible leads 42B at the inner ends 41 of conductive traces 38 with the contacts 54 of the first microelectronic element 50. In certain preferred embodiments, a bonding tape or adhesive (not shown) may be provided between the flexible substrate 22 and the first microelectronic element 50 using standard lamination or screen printing techniques to form a strong bond between the first microelectronic element 50 and the flexible substrate 22. The flexible leads 42B at the inner ends 41 of the conductive traces 38 are then bonded to the contacts 54 on the front face 52 of the first microelectronic element 50, such as by using an ultrasonic or thermosonic bonding technique conventionally known in the art or by using the various bonding techniques disclosed in U.S. Pat. Nos. 5,398,863; 5,390,844; 5,536,909 and 5,491,302.

A pre-formed compliant element 58, such as a compliant silicone elastomer material, is then deposited over the rear surface 56 of the first microelectronic element 50 so that the compliant element 58 completely covers the edges 60 and the rear surface 56 of the first microelectronic element 50. The compliant element 58 preferably includes a substantially continuous compliant pad having a pre-formed, cut-out region 62 or indentation having dimensions substantially similar to the external dimensions of the edges 60 and rear surface 56 of the first microelectronic element 50. The compliant element includes a relatively thick, rectangular ring-like structure 59 surrounding indentation 62, and a relatively thin compliant layer 61 forming a floor at the rear surface of the indentation. The cut-out region 62 intimately surrounds and engages the edges 60 and rear surface 56 of the first microelectronic element 50.

Figure 1C:
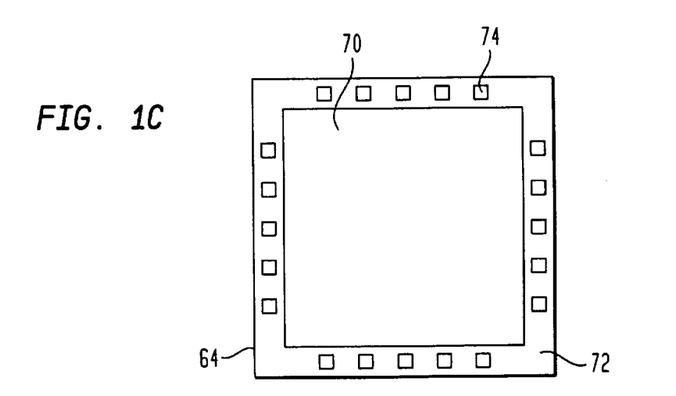
FIG. 1C shows a front view of a second microelectronic element shown in FIG. 1A.

Referring to FIGS. 1A and 1C, a second microelectronic element 64, which typically is a relatively large semiconductor chip such as a microprocessor, a microcontroller or an ASIC, is then provided over a rear surface 66 of the compliant element 58 remote from the rear surface 56 of the first microelectronic element 50. The second microelectronic element 64 is larger in size than the first microelectronic element 50. The second microelectronic element 64 desirably includes a front face 68 having a central portion 70, a peripheral portion 72 which surrounds the central portion 70 and contacts 74 disposed in the peripheral portion 72. The second microelectronic element 64 is assembled with the compliant element 58 so that the central portion 70 thereof is abutted against the rear surface 66 of the compliant element 58. Thus, the front face 68 of second microelectronic element 64 faces toward the first microelectronic element 50 and the substrate 22. Compliant layer 61 is disposed between the confronting faces of the microelectronic elements, whereas the ring-like structure 59 extends alongside of the first microelectronic element in the space between the second microelectronic element and substrate 22.

Figure 3:
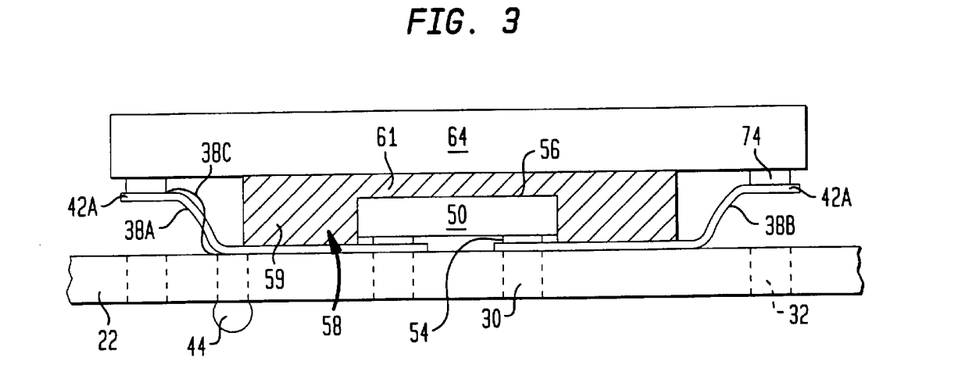
FIG. 3 shows a side view of the compliant multichip package shown in FIG. 1 during further stages of an assembly process.

Referring to FIG. 3, after the second microelectronic element 64 has been assembled to the compliant element 58, the second microelectronic element 64 overlies the first microelectronic element 50 and the flexible substrate 22, with the contacts 74 of the second microelectronic element 64 aligned with the exterior bond window 32. The flexible leads 42A at the outer ends 40 of the conductive traces 38 are then connected to the contacts 74 of the second microelectronic element 64. In this process, flexible leads 42A are bent downwardly to the vertically-extensive configuration depicted in FIG. 3. In this configuration, leads 42A extend alongside the outer edges of the compliant element 58.

When leads 42A are connected, traces 38 electrically interconnect the first and second microelectronic elements 50 and 64 with one another. Connection of flexible leads 42A to the second microelectronic element 64 also serves to connect the second microelectronic element to terminals 44. Only some of the conductive traces 38 are connected to the conductive terminals 44. For example, the conductive trace 38A shown on the left side of FIG. 3A interconnects the first and second microelectronic elements 50 and 64 with one another and with the conductive terminal 44. The conductive trace 38B on the right side of FIG. 3A interconnects the first and second microelectronic elements 50 and 64 with one another, however, it is not connected to a conductive terminal. Also, only some of the conductive traces 38 interconnect the first and second microelectronic elements. Thus, trace 38C connects the second microelectronic element to a terminal 44, but does not make connection with the first microelectronic element 50.

Figure 4:
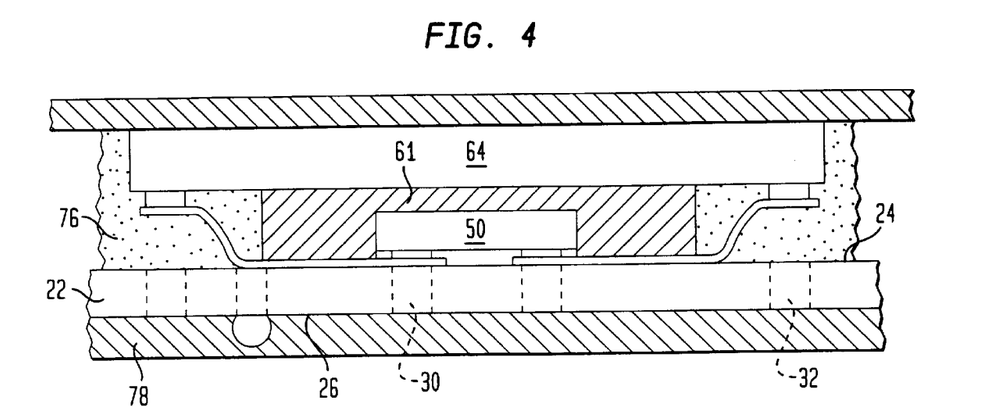
FIG. 4 shows the package of FIG. 3 during further stages of an assembly process.

Referring to FIG. 4, a curable liquid encapsulant 76, such as a liquid silicone elastomer, is then introduced between the second microelectronic element 64 and the first surface 24 of the flexible substrate 22. Before the curable liquid encapsulant is introduced, a protective coverlay 78, such as that disclosed in commonly assigned U.S. Provisional Patent Application Ser. No. 60/032,871 filed Dec. 13, 1996, the disclosure of which is incorporated herein by reference, is provided over the bottom surface 26 of the flexible substrate 22 to cover the interior and exterior bond windows 30 and 32. The coverlay, prevents the liquid encapsulant from flowing through the bond windows and contacting the terminals 44 at the bottom surface 26 of the flexible substrate 22. The curable liquid encapsulant 76 is then cured to form a compliant material, using energy such as heat or ultraviolet light. The compliant material formed from the cured encapsulant merges with the compliant material of the original compliant element 58 to form a larger compliant element encompassing the first and second microelectronic elements and flexible leads 42A.

The finished package can be handled, stored and shipped as a unit. It can be connected to a circuit panel (not shown) by bonding terminals 44 to contact pads on the circuit panel, as by solder bonding the terminals to the contact pads.

Figure 5:
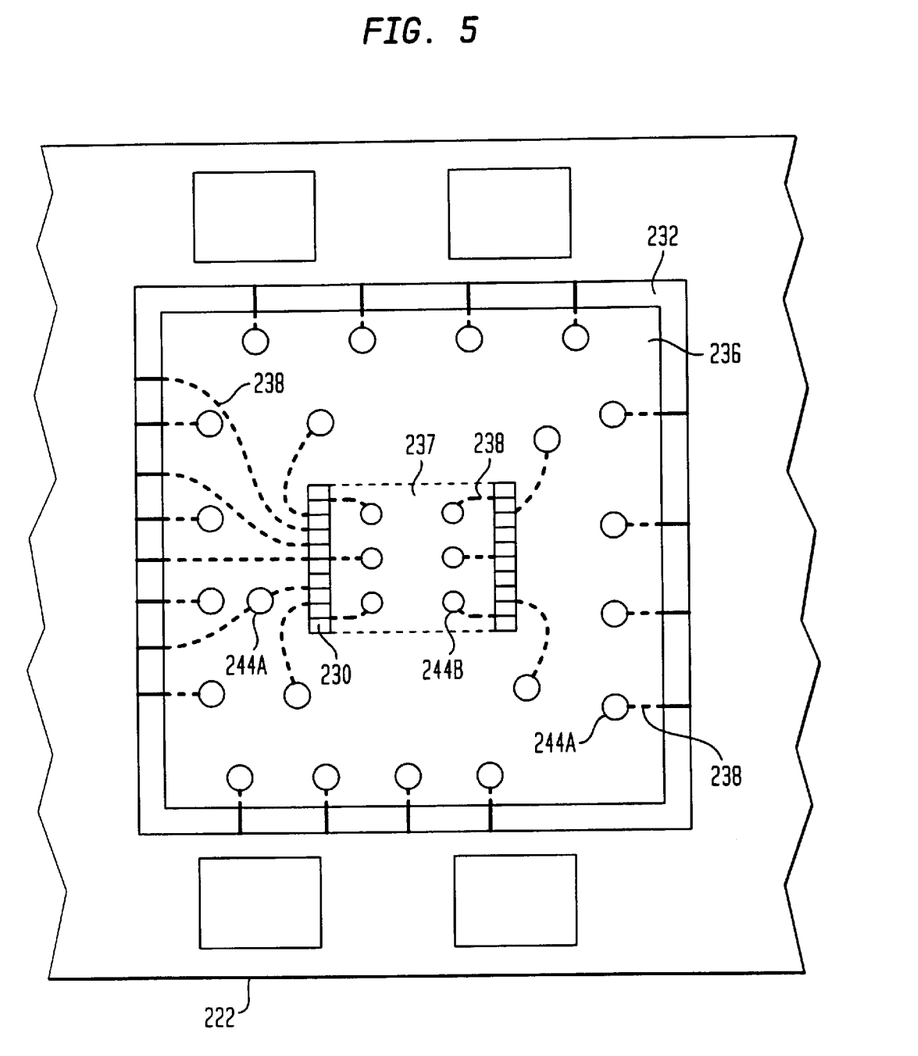
FIG. 5 shows a bottom fragmentary view of the flexible substrate shown in FIG. 1 according to yet another preferred embodiment of the present invention.

FIG. 5 shows a flexible substrate 222 according to yet another embodiment which includes conductive terminals 244B which are accessible at the central region 237 of the flexible substrate and which are connected to conductive traces 238 running to the interior bond window 230. The flexible substrate also includes conductive terminals 244A which are accessible at the inner region 236 of the flexible substrate 222 and which are connected to conductive traces extending toward the exterior bond window 232 or which extend between the exterior bond window 232 and the interior bond window 230. Substrate 222 can be used in the same manner as the substrate discussed above with reference to FIGS. 1–4.

Figure 6:
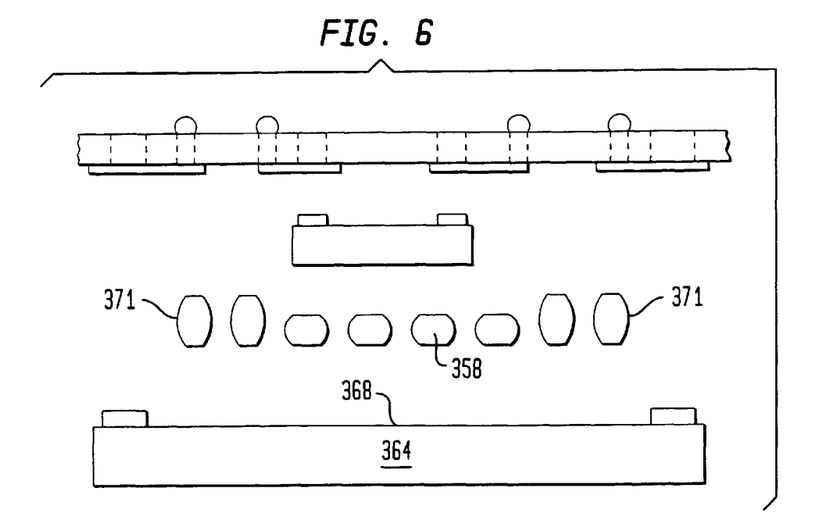
FIG. 6 shows an exploded side view of a compliant multichip package according to another embodiment of the present invention.
Figure 7:
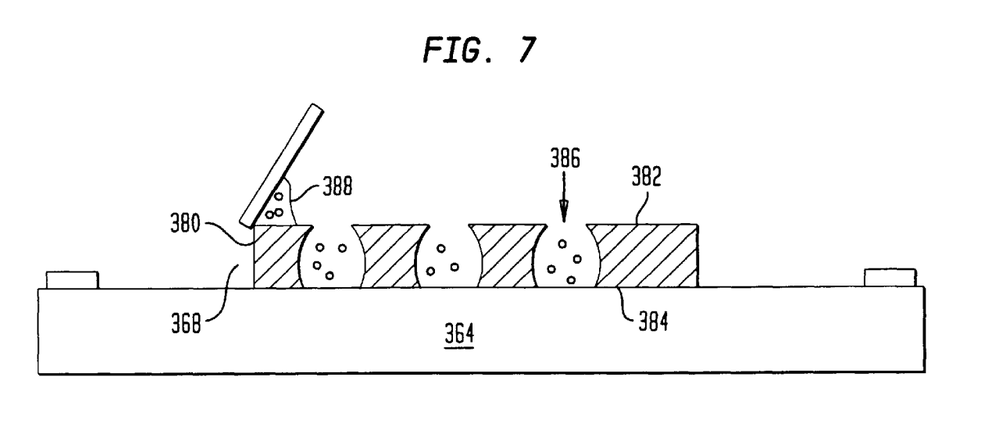
FIG. 7 shows the compliant multichip package shown in FIG. 6 during one stage of an assembly process

Referring to FIG. 6, in another embodiment of the present invention the compliant element includes a plurality of central compliant pads 358 which are provided over the central region of front face 368 of the second microelectronic element 364. The compliant element also includes a plurality of peripheral compliant pads 371 provided over the peripheral region of the second microelectronic element. As shown in FIG. 7, a stencil 380 having a top surface 382 and a bottom surface 384 with a plurality of apertures 386 formed therein is provided over the central region of front face 368 of the second microelectronic element 364 so that the bottom surface 384 of the stencil mask 380 abuts against the front face 368 of the second microelectronic element 364. A curable liquid material 388, such as a curable silicone elastomer, is then screened or stenciled printed across the top surface 382 of the stencil mask 380 so that the silicone elastomer 388 fills the apertures 386. The stencil mask 380 is then removed from engagement with the front face 368 of the second microelectronic element 364. The uncured silicone elastomer pads 358 remain on the front face 368 of the second microelectronic element 364. Peripheral compliant pads 371 are formed using a similar stencil (not shown) overlying the peripheral region of the microelectronic element. The compliant pads 358 and 371 preferably are only partially cured, so that they have sufficient rigidity to remain in place but still remain tacky. The cure is not completed until later stages of the assembly process.

Figure 8:
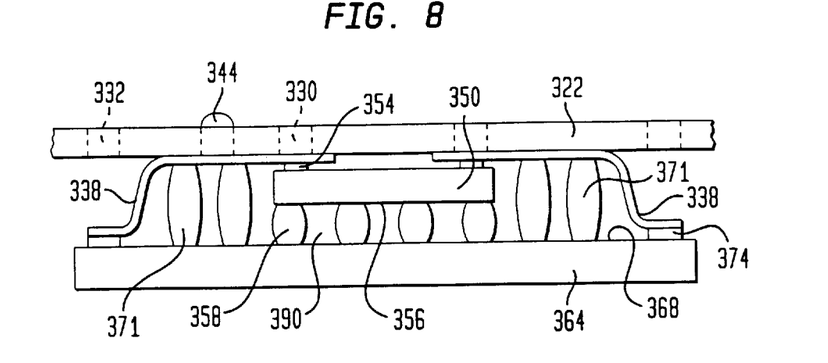
FIG. 8 shows a side view of the compliant multichip package shown in FIG. 6 during further stages of an assembly process according to preferred embodiments of the present invention.

Referring to FIG. 8, the rear face 356 of the first microelectronic element 350 is then abutted against surfaces of the compliant pads 358 which are remote from the front face 368 of the second microelectronic element 364. The flexible substrate 322 is then assembled with the first and second microelectronic elements 350 and 364 so that the interior bond window 330 is aligned with the contacts 354 of the first microelectronic element 350 and the exterior bond window 332 is aligned with the contacts 374 of the second microelectronic element 364. The peripheral region of substrate 322 is supported by the peripheral compliant pads 371. The first and second microelectronic elements 350 and 360 are then electrically interconnected with one another and with at least some of the conductive terminals 344 using the bonding techniques described above. In a variant of the process, the pad assembly process described above may be reversed. In these embodiments the first microelectronic element 350 is assembled with the flexible substrate 322 and the compliant pads 358 are assembled with the rear surface 356 of the first microelectronic element 350. Peripheral pads 371 are assembled to the peripheral region of the substrate. The second microelectronic element is then assembled with the compliant pads 358 and 371, and the first and second microelectronic elements 350 and 364 are then interconnected with one another and with at least some of the conductive terminals 344.

Figure 9:
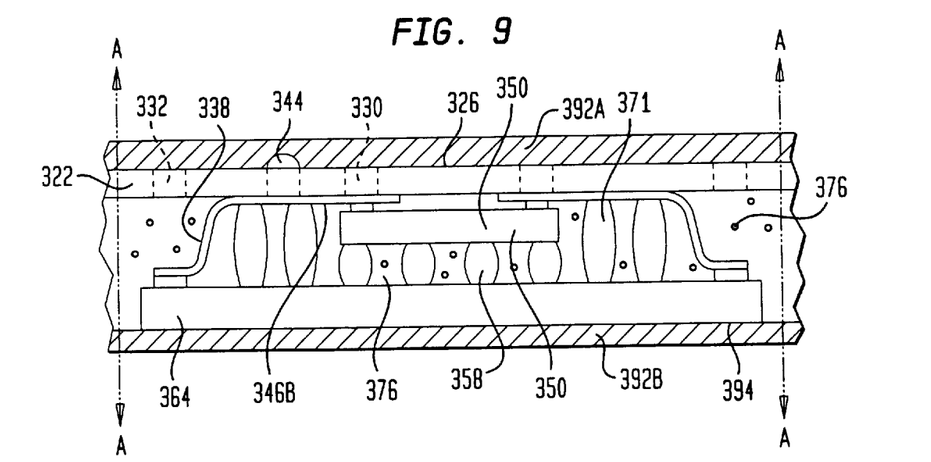
FIG. 9 shows a side view of the package shown in FIG. 8 during further stages of an assembly process according to preferred methods of the present invention.

Referring to FIG. 9, a curable liquid encapsulant 376 is introduced between the second microelectronic element 364 and the flexible substrate 322 in accordance with the methods described in U.S. Pat. No. 5,659,952, the disclosure of which is hereby incorporated by reference herein. Before the liquid encapsulant is introduced, a protective coverlay 392A, such as that disclosed in copending, commonly assigned U.S. patent application Ser. No. 08/726,697, the disclosure of which is incorporated by reference herein, is provided over the second surface 326 of the flexible substrate 322 to prevent the curable liquid encapsulant 376 from flowing through the interior and exterior bond windows 330 and 332 and contacting the conductive terminals 344 accessible at the second surface 326 of the flexible substrate 322. A second protective coverlay 392B may be provided over the rear surface 394 of the second microelectronic element 364. After the liquid encapsulant 376 is introduced, it surrounds the conductive traces 338 and passes through the channels 390 between the compliant pads 358 and 371. The encapsulant is then cured using energy such as heat or ultraviolet light. The encapsulant 376 is preferably CTE matched with the compliant pads 358 and 371 so that the pads and the encapsulant form a uniform compliant element between the second microelectronic element 364 and the flexible substrate 322. The protective coverlays 392A and 392B may be removed after the curable liquid encapsulant 376 has been cured or may remain in place while the package is in storage to protect the package and the conductive terminals 344 from contamination. As a final stage in the process, the outer portion of the compliant element formed by encapsulant 376 may then be severed outside the periphery of the second microelectronic element 364, along the axis designated A—A, to provide an individual compliant multichip packages of precise size.

Figure 10:
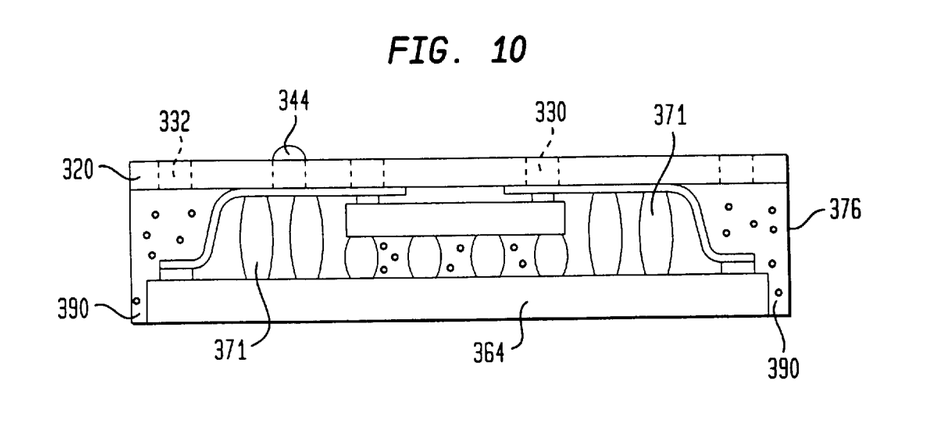
FIG. 10 shows a side view of the package shown in FIG. 9 during further stages of an assembly process according to preferred embodiments of the present invention.

Referring to FIG. 10, after the encapsulant layer 376 has been severed, the encapsulant layer extends beyond the perimeter of the second microelectronic element to provide resilient bumpers 390 around the perimeter of the package.

Figure 11:
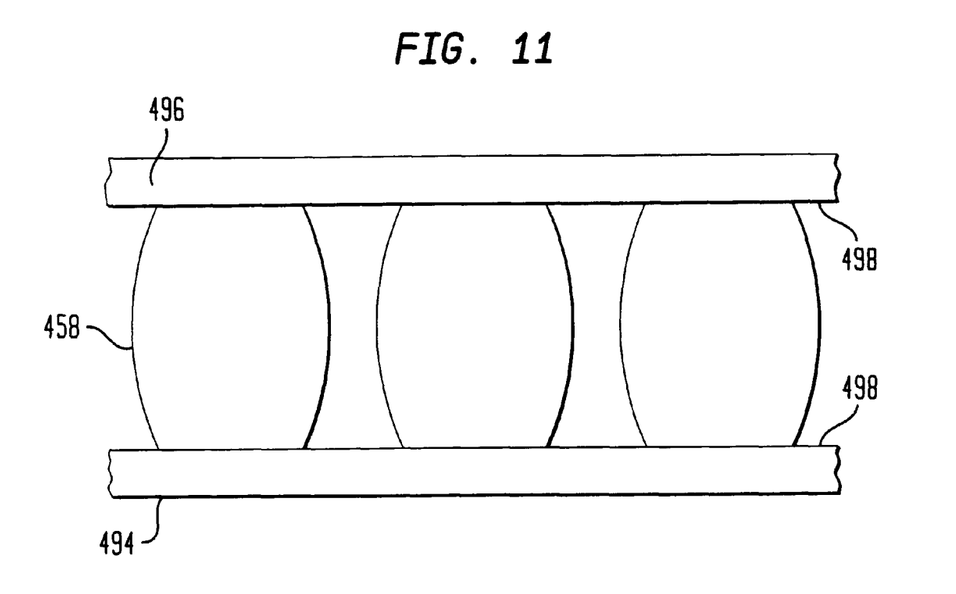
FIG. 11 shows a fragmentary side view of a plurality of compliant pads used during assembly of a compliant multichip package according to further preferred embodiments of the present invention.

Referring to FIG. 11 in another preferred embodiment of the present invention the plurality of compliant pads 458 described above may be transferable, such as those disclosed in U.S. patent application Ser. No. 08/879,922, the disclosure of which is incorporated by reference herein. In this particular embodiment, the plurality of compliant pads 458 are initially stored separately from the other package elements, between a first storage liner 494 and a second storage liner 496. The first and second storage liners 494 and 496 include a tacky material 498, such as an adhesive, which provides tack to the top and bottom surfaces of the compliant pads 458. The tacky material 498 may be an adhesive such as a pressure sensitive adhesive or other known adhesive for providing the surface regions of the compliant pads 458 with tack. During assembly operations, the first storage liner 494 is peeled away from the plurality of compliant pads 458 to expose the bottom surfaces of the compliant pads. Prior to peeling off the first liner 494, heat may be applied to the exterior surface of the first liner 494 to reduce the level of tack between the first liner 494 and the compliant pads 458 to thereby ensure that the compliant pads 458 will remain attached to the second liner 496 until it is desirable to remove the second liner 496. After heat has been applied, the first liner 494 should preferably be pulled at a severe angle which further ensures that the compliant pads 458 remain attached to the second storage liner 496.

Figure 12:
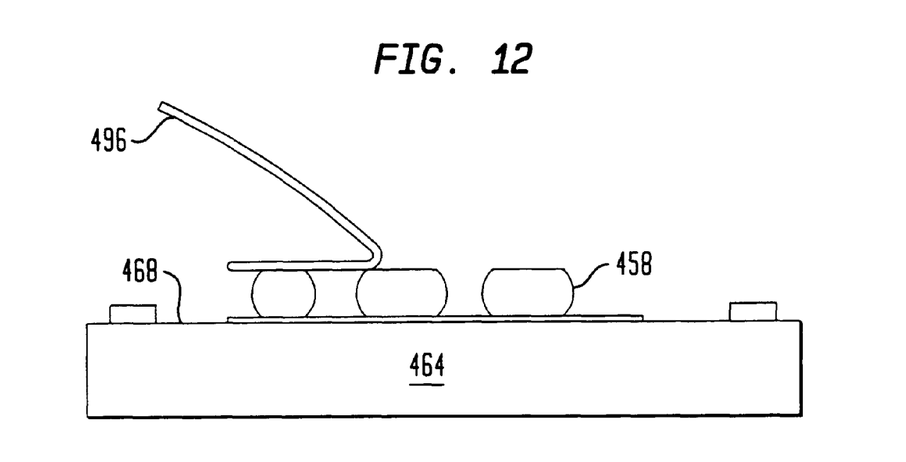
FIG. 12 shows a fragmentary side view of the compliant pads shown in FIG. 11 during further stages of an assembly process according to preferred embodiments of the present invention.

Referring to FIG. 12, after the first liner has been removed, the compliant pads 458 are assembled to the front face 468 of the second microelectronic element 464. The second storage liner 496 is then removed from the compliant pads 458 to expose the top surface region thereof and the rear surface of the first microelectronic element (not shown) is preferably abutted against the top surface of the compliant pads 458. The flexible substrate is then assembled with the first microelectronic element as described above with reference to FIGS. 8–10. Peripheral compliant pads (not shown) are provided by a similar process. In other preferred embodiments the transferable compliant pads are first assembled with the rear surface of the first microelectronic element and with the peripheral portion of the substrate.

Figure 13:
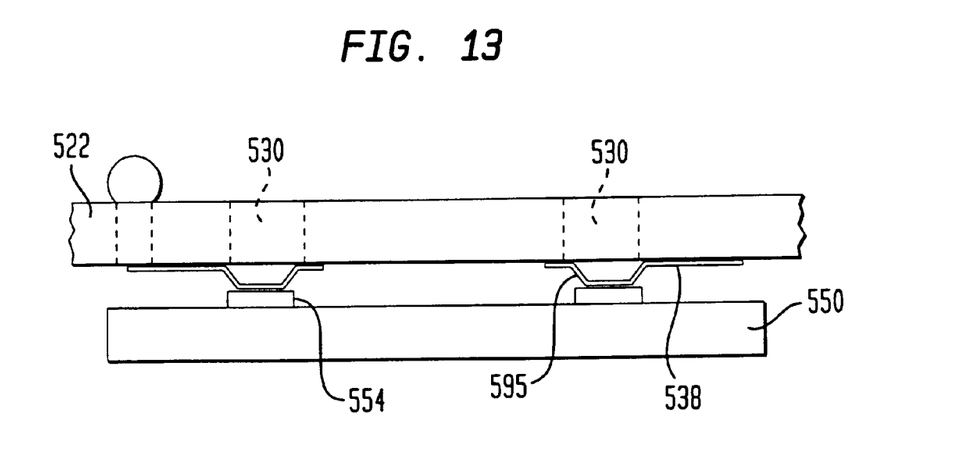
FIG. 13 shows a fragmentary side view of a compliant multichip package according to yet another preferred embodiment of the present invention.
Figure 14:
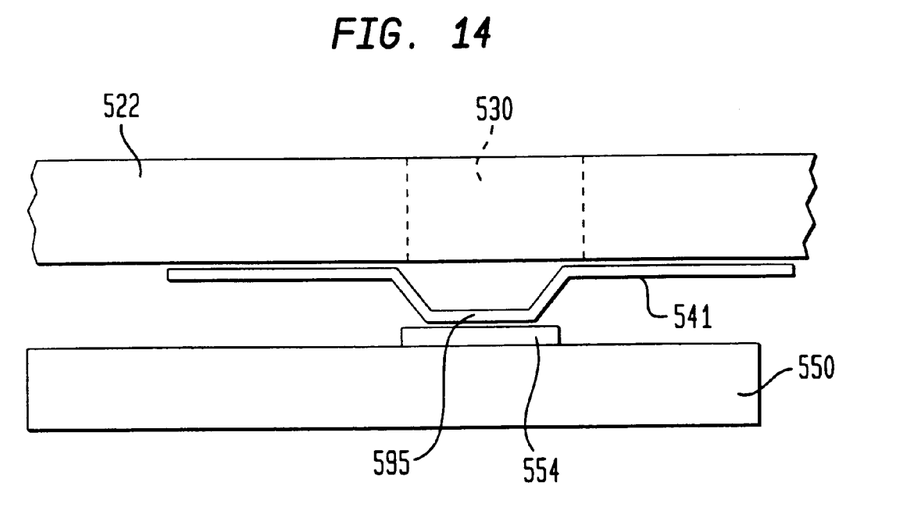
FIG. 14 shows close-up fragmentary side view of the compliant multichip package shown in FIG. 13.

Referring to FIGS. 13 and 14, in other preferred embodiments of the present invention the inner ends 541 of the conductive traces 538 which extend to the interior bond window 530 are releasably attached to the flexible substrate 522. In these embodiments, the inner ends 541 of the conductive traces 538 bridge the bond windows 530. The inner ends 541 are bonded to the contacts 554 of the first microelectronic element by advancing a thermosonic, ultrasonic or other similar bonding tool into the bond window to form permanent bonds 595 between the lead ends and the contacts 554. Although the bonds 595 are depicted in FIGS. 13 and 14 as having some downward bending relative to the rest of the conductive traces, this is not essential. The inner ends of the traces need not be flexible. Rigid connections between the inner ends of the traces and the first microelectronic element do not provide for mechanical decoupling of the first microelectronic element and the substrate. However, where the first microelectronic element is relatively small, the stresses created during operation by differential thermal expansion and warpage of the first microelectronic element are also relatively small. Therefore, the absence of mechanical decoupling can be tolerated at these connections. However, the outer ends of the leads, which are connected to the larger, second microelectronic element, should be flexible to accommodate the larger relative motion of the contacts on the second microelectronic element. Stated another way, mechanical decoupling of the second microelectronic element from the substrate is more important than mechanical decoupling of the first microelectronic element from the substrate.

Figure 15:
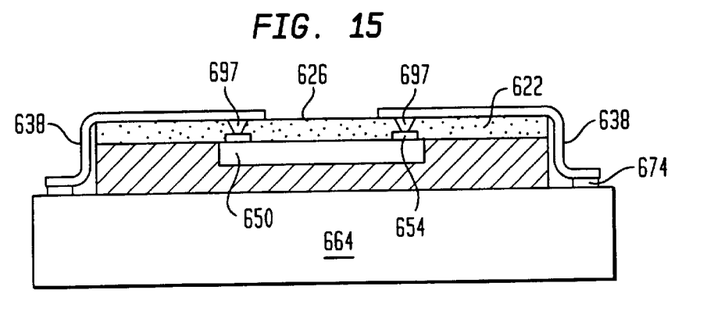
FIG. 15 shows a side view of a compliant multichip package according to yet another preferred embodiment of the present invention.

Referring to FIG. 15, in another embodiment of the present invention the conductive traces 638 are provided over the second surface 626 of the flexible substrate 622, facing away from the microelectronic elements. The contacts 654 of the first microelectronic element 650 electrically connected to the conductive traces 638 through conductive vias 697 extending through the flexible substrate 622.

Figure 16:
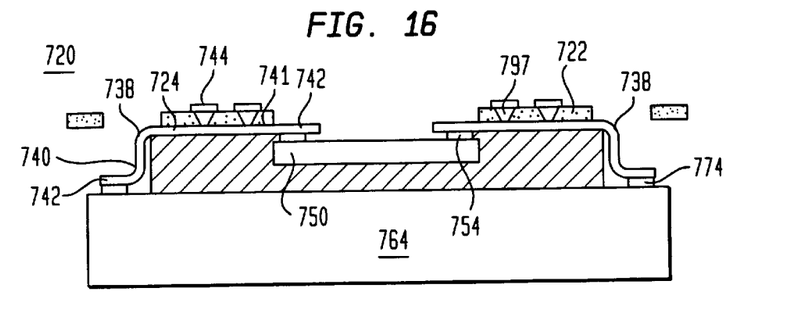
FIG. 16 shows a side view of a compliant multichip package according to still another preferred embodiment of the present invention.
Figure 17:
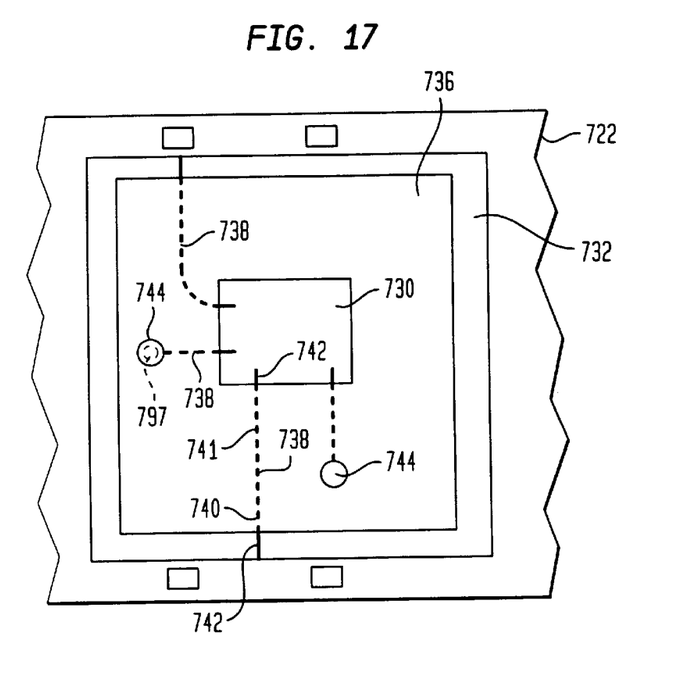
FIG. 17 shows a fragmentary top view of the package shown in FIG. 16 during one stage of an assembly process.

Referring to FIGS. 16 and 17, in accordance with another preferred embodiment of the present invention, the flexible substrate 722 includes an interior bond window 730 which is a unitary central aperture extending between the top and bottom surface thereof. In this embodiment, the central region of the substrate inside of the interior bond window used in the embodiments discussed above is omitted. The conductive traces 738 extend across the first surface 724 of the flexible substrate 722. The inner ends 741 of the conductive traces 738 include flexible leads 742 which are cantilevered over the central aperture. The flexible leads 742 at the inner ends 741 of the conductive traces 738 are connected to the contacts 754 of the first microelectronic element 750 through conventional tape automated bonding techniques. The flexible leads 742 at the outer ends 740 of the conductive traces 738 are connected to the contacts 774 of the second microelectronic element 764 in a substantially similar manner. The conductive traces 738 are electrically connected to the conductive terminals 744 through conductive vias 797 extending through the flexible substrate 722. The flexible leads 742 at the inner and outer ends of the conductive traces 738 are preferably encapsulated using the curable liquid encapsulant processes described above. The encapsulant (not shown) is then cured to provide a compliant layer for the package 720.

As will be appreciated, numerous further variations and combinations of the features discussed above can be utilized without departing from the present invention as defined by the claims. For example, the compliant layer disposed between the first and second microelectronic elements, such as compliant layer 61 (FIGS. 1A, 3 and 4), may be omitted. The rear surface of the first microelectronic element may be bonded to the front surface of the second microelectronic element. This results in loss of the mechanical decoupling function provided by the compliant layer. Conversely, an additional compliant layer can be provided between the first microelectronic element and the substrate, and flexible leads can be used at the inner ends of the traces. These features provide mechanical decoupling of the first microelectronic element and the substrate. Additional microelectronic elements may be stacked atop or between the first and second microelectronic element and electrically interconnected thereto, preferably by traces on the substrate. In these embodiments, additional compliant elements may be provided between each additional microelectronic element. In other embodiments, the multichip packages may include the first and second microelectronic elements provided one atop the other with additional microelectronic elements provided to the side(s) of the first and second microelectronic elements. The additional microelectronic elements provided to the side(s) are also disposed within the package. In still other embodiments, the package may include additional packaging elements such as a metallic heat sink or protective cover overlying the rear surface of the second microelectronic element and preferably surrounding the other components. In further preferred embodiments, a plurality of the above-described multichip packages are provided side-by-side so that the packages may be simultaneously encapsulated to provide a unitary compliant element extending into several packages. The unitary compliant element is then severed to separate the packages from one another. For example, the second microelectronic elements may be chips constituting parts of a wafer, and the remaining process steps may be performed before severing the chips from one another while also severing the unitary compliant element. Thus, the foregoing descriptions of the preferred embodiments should be taken by way of illustration rather than by way of limitation of the invention as defined in the claims.

What is claimed is:

1. A multichip package comprising:

a substrate including a plurality of conductive traces and flexible leads connected to outer ends of at least some of said conductive traces adjacent the periphery of said flexible substrate, said substrate including conductive terminals accessible at a surface thereof connected to at least some of said traces;

a first microelectronic element having a front face including contacts and a back face, the front face of said first microelectronic element confronting said flexible substrate;

a second microelectronic element larger than said first microelectronic element, said second microelectronic element having a front face including contacts, said second microelectronic element overlying said first microelectronic element with said front face of said second microelectronic element facing toward said substrate, a compliant element disposed alongside said first microelectronic element between said second microelectronic element and said substrate, wherein said flexible leads are connected to said second microelectronic element and at least some of said traces are connected to said first microelectronic element for electrically interconnecting said first and second microelectronic elements with one another and with said terminals.

2. A package as claimed in claim 1 wherein said compliant element includes a compliant layer extending between said back face of said first microelectronic element and said front face of said first microelectronic element.

3. A package as claimed in claim 2 wherein said substrate is flexible.

4. A package as claimed in claim 3, wherein said flexible substrate includes an interior bond window and said conductive traces have inner ends extending at least partially across said interior bond window.

5. A package as claimed in claim 4, wherein the inner ends of said conductive traces include flexible leads.

6. A package as claimed in claim 4, wherein the contacts of said first microelectronic element are aligned with said interior bond window.

7. A package as claimed in claim 3, wherein said flexible substrate includes a central region bounded and defined by said interior bond window, and wherein said first microelectronic element overlies said central region of said flexible substrate.

8. A package as claimed in claim 7, wherein the front face of said first microelectronic element includes a central portion and a peripheral portion surrounding said central portion, said contacts of said first microelectronic element being disposed in said peripheral portion of said front face.

9. A package as claimed in claim 8, wherein the central portion of said first microelectronic element is in contact with the central region of said flexible substrate.

10. A package as claimed in claim 3, wherein said first microelectronic element is a memory chip.

11. A package as claimed in claim 10, wherein said second microelectronic element is selected from the group consisting of microprocessors, microcontrollers, and application specific integrated circuits.

12. A package as claimed in claim 3 wherein said compliant element includes compliant encapsulant surrounding said flexible leads.

13. A package as claimed in claim 12, wherein said compliant element extends beyond the periphery of said package to provide a compliant bumper surrounding said package.

14. A package as claimed in claim 3, wherein said compliant element includes a substantially continuous compliant pad which completely covers said first microelectronic element.

15. A package as claimed in claim 3, wherein the front face of said second microelectronic element includes a central portion and a peripheral portion surrounding said central portion, said contacts of said second microelectronic element being disposed in said peripheral portion of said front face.

16. A package as claimed in claim 15, wherein the central portion of said second microelectronic element is in contact with said compliant element.

* * * * *